United States Patent
Bjorndahl et al.

(10) Patent No.: US 6,372,999 B1
(45) Date of Patent: Apr. 16, 2002

(54) MULTILAYER WIRING BOARD AND MULTILAYER WIRING PACKAGE

(75) Inventors: William D. Bjorndahl, Torrance; M. David Saferstein, Los Angeles; Alexander Krayner, Sherman Oaks; Cindy S. Fietze, Redondo Beach; Kenneth C. Selk, Hermosa Beach; Rene R. Martinez, Lakewood; William E. McMullen, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/295,037

(22) Filed: Apr. 20, 1999

(51) Int. Cl.[7] .................... H01R 12/04; H05K 1/11
(52) U.S. Cl. ............................. 174/262; 174/52.2
(58) Field of Search .................. 174/255, 262, 174/263, 264, 265, 52.2; 361/760

(56) References Cited

U.S. PATENT DOCUMENTS

| | | | | |
|---|---|---|---|---|
| 4,868,350 A | * | 9/1989 | Hoffarth et al. | 174/68.5 |
| 4,882,839 A | | 11/1989 | Okada | 29/853 |
| 4,902,556 A | | 2/1990 | Benedikt | 428/209 |
| 4,963,697 A | * | 10/1990 | Peterson et al. | 174/252 |
| 5,500,804 A | | 3/1996 | Hunsinger | 364/488 |
| 5,593,720 A | | 1/1997 | Abn | 427/97 |
| 5,662,761 A | | 9/1997 | Middelman | 156/324 |
| 6,076,100 A | * | 6/2000 | Farquhar et al. | 29/852 |
| 6,096,411 A | * | 8/2000 | Nakatani et al. | 428/209 |
| 6,121,553 A | * | 9/2000 | Shinada et al. | 174/259 |
| 6,175,087 B1 | * | 1/2001 | Keesler et al. | 174/261 |
| 6,248,958 B1 | * | 6/2001 | McClure et al. | 174/256 |

OTHER PUBLICATIONS

GE Electromaterials Web Page Excerpts.

* cited by examiner

Primary Examiner—Jeffrey Gaffin
Assistant Examiner—Jeremy Norris
(74) Attorney, Agent, or Firm—Antonelli, Terry, Stout & Kraus, LLP

(57) ABSTRACT

A multilayer wiring board 10 comprises a substrate having a plurality of layers of reinforced resin material 12,18,19, 26,18',19',26', a patterned conductive layer 28,28' provided on at least one major surface of the substrate, a plurality of via holes 30,32,34,36 provided at least partly through the substrate, and a plurality of signal carrying wires 20,20'. The signal carrying wires 20,20' are provided between at least two of the layers of reinforced resin material 12,18,19,26, 18',19',26'. The signal carrying wires 20,20' can be embedded in a resin layer 21,21', and the resin layer 21,21' sandwiched between a pair 18,19,18',19 of the layers of reinforced resin material. The reinforced resin material 12,18,19,26,18',19 is preferably a fiber reinforced resin material, such as a glass fiber reinforced epoxy or polyimide material. In some applications, a constrained core 22,24,22', 24', e.g., a copper/ molybdenum/copper laminate, can be provided between a major surface of the substrate and the pair 18,19,18',19 of reinforced resin layers sandwiching the signal carrying wires 20,20'. The board 10 can be used in a multilayer wiring package wherein a plurality of integrated circuit chips are mounted on a major surface of the board 10. Applications include digital, high-speed digital and RF interconnects.

14 Claims, 1 Drawing Sheet

MULTILAYER WIRING BOARD AND MULTILAYER WIRING PACKAGE

BACKGROUND OF THE INVENTION

The present invention relates to a multilayer wiring board and to multilevel high speed digital packaging using the board in which interconnecting wiring between the high speed digital components or circuits is performed within the circuit board as opposed to on top of the circuit board, resulting in a reduction in circuit board thickness.

U.S. Pat. No. 5,500,804 discloses a multiple wiring media package in which the conducting wires are placed on top of the substrate and interconnections to other wires as well as other substrates are made through via holes penetrating into the circuit board.

U.S. Pat. No. 4,902,556 discloses using multilevel laminates incorporating alternating layers of epoxy and polynorbornene, where layers of copper films are deposited at the interface between the board layers and are etched to form signal lines between board layers. A brief history of laminate boards is included in the "Background Of The Invention" section of this patent.

U.S. Pat. No. 5,662,761 discloses reinforced multilevel board using a cross-ply laminate in combination with a UD fiber matrix, which has fibers overlapping and oriented in opposite directions.

High density multilevel packaging can be performed by embedding bundles of wires within a low modulus material, On the top surface of the low modulus material, RF and digital chips, such as the central processing chips or the memory circuits are soldered, or otherwise attached, to a printed circuit board layout. Within the low modulus material structure the wires criss-cross on top of each other while providing interconnections between circuitry on top of the board. This criss crossing of wires allows a significant savings in board thickness as well as surface area.

However, this method of manufacturing the multilevel digital board has some disadvantages. For example, when a digital circuit on the surface of the multilevel board needs to be replaced, the removal of the digital chip causes the embedded wires to flex and to deform because these wires are embedded in a low modulus material near the top of the board where the digital chips are located. Moreover, when the multilevel digital board is mounted down to effect chip removal or to populate the board, or at the next level of assembly, the low modulus material has a tendency to creep at the clamping or mounting sites. Moreover, the signal wires radiate electrical noise and are themselves subject to receiving external electrical noise. Moreover, the heat generated by the digital chips must conduct to the deeper layers of the board to reach a relatively dense conductive layer that will spread the heat and conduct it to mounting points. This is especially important in space applications where there is no air convection cooling.

Thus, there is a need to produce a multilevel digital circuit board that is more resistant to compressive or tensile creep, both to prevent the loss of mounting or clamping forces on the circuit board and to prevent the wires from being damaged when the digital board requires either populating for the first time with digital circuits, or refitting of the board with new digital circuits. There is also a need to provide thermally conductive layers close to the surface on which the digital chips are mounted. There is also a need to shield the signal wires from emitting or receiving electrical noise.

SUMMARY OF THE INVENTION

The present invention solves these problems by providing a multilayer wiring board which comprises a substrate having a plurality of layers of reinforced resin material, a patterned conductive layer provided on at least one major surface of the substrate, a plurality of via holes provided at least partly through the substrate, and a plurality of signal carrying wires. The signal carrying wires are provided between at least two of the layers of reinforced resin material. The signal carrying wires can be embedded in a resin layer, and the resin layer sandwiched between a pair of the layers of reinforced resin material. The reinforced resin material is preferably a fiber reinforced resin material, including but not limited to a glass fiber reinforced epoxy or polyimide material. In some applications, a constrained core, e.g., a copper/molybdenum/copper laminate, can be provided between a major surface of the substrate and the pair of reinforced resin layers sandwiching the signal carrying wires. The constrained core provides a stiffer board and can be used as a power or ground line or thermal transfer. The board can be used in a multilayer wiring package wherein a plurality of integrated circuit chips are mounted on a major surface of the board.

The present invention provides a more robust multilevel wiring board by using a new layer structure, including prepreg of fairly high modulus material, to hold the wires in place, and by burying the digital wires deep within the multilevel structure so that the flexing of the circuit board, caused when the individual digital circuits or chips are inserted or removed from the board, does not cause breakage or crushing of the digital wires. Using the board of the present invention, mounting of the high speed digital or RF hardware can be accomplished with fasteners and without cold flow. The fasteners do not loose torque; thus, retorquing is not required whenever the multilevel board is attached to the next level of assembly.

DETAILED DESCRIPTION OF THE PREFERRED EMBODIMENTS

Figure 1:
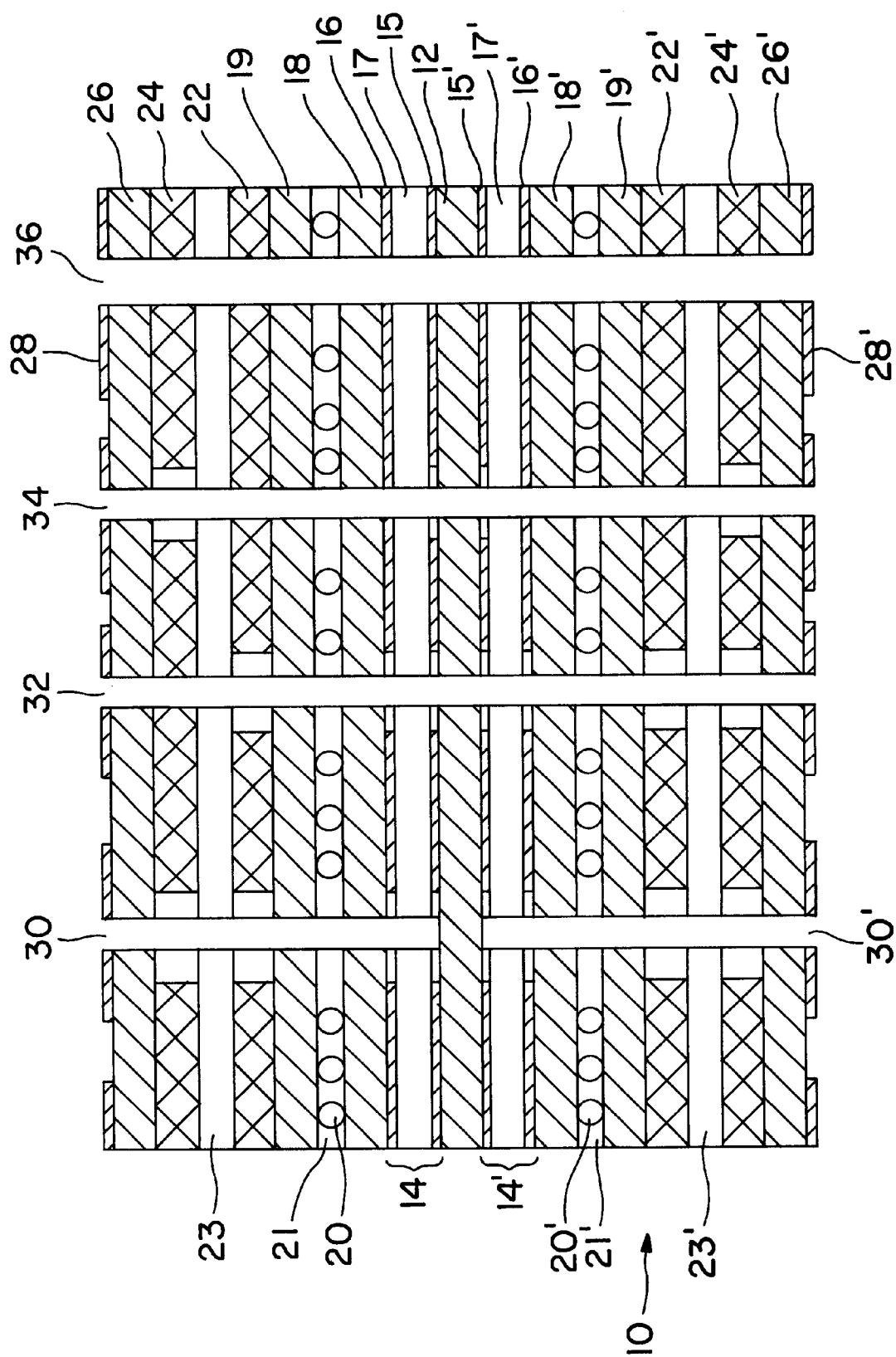
FIG. 1 is a cross sectional view of the multilayer wiring board of the present invention.

FIG. 1 shows the multilayer wiring board of the present invention, generally designated with the reference numeral 10. The wiring board 10 can be prepared by a lamination process starting with a reinforced resin material layer, or prepreg, 12. The reinforced resin material or prepreg 12 is preferably a fiber reinforced resin material such as a glass fiber reinforced thermosetting resin including but not limited to e.g., an epoxy/glass or polyimide/glass prepreg. Cores 14 and 14' are laminated to the fiber reinforced resin prepreg 12. Each core 14, 14' comprises a copper (or other conductor) 15, 15' serving as a power, signal, ground, or dummy pad, a copper or other conductor 16, 16' serving as a power, signal, ground, or dummy pad, and an insulator 17, 17'. Other cores such as 14 and 14' can be added as necessary. Laminated to the cores 14, 14' are laminate structures comprising a pair of fiber reinforced resin prepregs 18, 19 or 18', 19' which sandwich a plurality of signal carrying wires 20, 20' embedded in resin material 21, 21'. The resin material 21, 21' can be a low modulus material such as an unreinforced thermosetting resin. Since the digital wires 20, 20' are embedded within a stronger, higher-modulus material than prior printed circuit boards, this prevents damage to the wires 20, 20' during digital board assembly or rework.

Signal, ground, or power conductors 22, 22' and 24, 24' can be provided separated by an insulator 23. The signal, or power conductors ground 22, 22' and 24, 24' can be made of copper or another conductive material or, in order to provide the board with even greater rigidity and strength, these lines can be made of constrained cores, including, but not limited to e.g., a copper/molybdenum/copper laminate or copper/invar™/copper laminate.

Insulating layers 26, 26' are provided on which are provided a conductive pattern, e.g., copper foils 28, 28'.

As is known in the art, via holes are provided, e.g., by drilling, with FIG. 1 showing typical via holes, such as a near side and far side blind via hole 30, 30' respectively, a plated via hole 32, a plated through thermal via 34 and an unplated through hole 36.

Integrated circuit chips can be electrically connected to the multilayer wiring board 10, in any manner known in the art.

The digital wires 20, 20' can criss cross between fiber reinforced prepegs 18, 19 and 18' and 19' to provide interconnecting wiring between digital circuit components, the latter of which can be connected to copper foils 28, 28'. The wires 20, 20' can be made of insulated copper or copper cadmium and can have a standard diameter, such as 0.002 inches (AWG 44 gauge size), 0.004 inches (AWG 38 gauge size), or 0.006 inches (AWG 34 gauge size).

The present invention provides a more robust multilevel wiring board 10 by using a new layer structure, including prepreg 18, 19 and 18',19' of fairly high modulus material, to hold the wires in place, and by burying the digital wires 20,20' deep within the multilevel structure so that the flexing of the circuit board 10, caused when the individual digital circuits or chips are inserted or removed from the board 10, does not cause breakage or deformation of the digital wires 20,20'. Using the board 10 of the present invention, mounting of the digital hardware can be accomplished with fasteners which do not loose torque; thus, retorquing is not required whenever the multilevel board is flexed during insertion or removal of digital hardware or during the next level of assembly.

The conductive layers 22, 22', 24, 24', 28, and 28' can provide relatively continuous electrically conductive plane outside of the signal wires 20, 20'. Any one or more of these conductive layers can be connected to ground or power supply, thus providing an electrical shield to block internally generated or externally generated electrical noise.

The conductive layers 22, 22', 24, 24', 28, and 28' can provide a relatively continuous thermally conductive plane close to the surface-mounted parts. This provides a superior path to conduct heat away from the surface-mounted parts and to the mounting hardware.

What is claimed is:

1. A multilayer wiring board, comprising:
    a substrate comprising a plurality of layers of reinforced resin material;
    a patterned conductive layer provided on at least one major surface of the substrate;
    a plurality of via holes provided at least partly through the substrate;
    a plurality of signal carrying wires provided between at least two of the layers of reinforced resin material; and
    at least one constrained core provided between the signal carrying wires and a major surface of the substrate, the at least one constrained core being made of conductive material.

2. A multilayer wiring board according to claim 1, wherein the reinforced resin material comprises a fiber reinforced resin material.

3. A multilayer wiring board according to claim 2, wherein the reinforced resin material is a reinforced epoxy or polyimide material.

4. A multilayer wiring board according to claim 3, wherein the fiber is glass fiber.

5. A multilayer wiring board according to claim 1, wherein the patterned conductor surface layer is a patterned copper foil.

6. A multilayer wiring board according to claim 1, wherein the signal carrying wires comprise copper or a copper cadmium alloy.

7. A multilayer wiring board according to claim 1, wherein the signal carrying wires comprise a core comprising copper and an insulating layer surrounding the core.

8. A multilayer wiring board according to claim 1, wherein said at least one constrained core comprises a copper/Invar/copper laminate.

9. A multilayer wiring board according to claim 1, wherein the at least one constrained core comprises a copper/molybdenum/copper laminate.

10. A multilayer wiring board according to claim 1, wherein the substrate further comprises a metallic conductor functioning as a ground or power line provided between the signal carrying wires and a major surface of the substrate.

11. A multilayer wiring board according to claim 1, wherein the signal carrying wires are embedded in a resin layer, and the resin layer is sandwiched between a pair of the layers of reinforced resin material.

12. A multilayer wiring board according to claim 11, wherein the substrate further comprises a metallic conductor provided between the signal carrying wires and a major surface of the substrate.

13. A multilayer wiring board according to claim 1, wherein said at least one constrained core comprises a pair of constrained cores, each of the pair of constrained cores being made of conductive material, the pair of constrained cores being separated by a dielectric material.

14. A multilayer wiring package comprising the multilayer wiring board according to claim 1 and a plurality of integrated circuit chips mounted on a major surface thereof.

* * * * *